United States Patent
Hsu

(10) Patent No.: US 12,081,206 B2
(45) Date of Patent: Sep. 3, 2024

(54) VOLTAGE-MODE TRANSMITTER

(71) Applicant: REALTEK SEMICONDUCTOR CORPORATION, Hsinchu (TW)

(72) Inventor: Bo-Hao Hsu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/951,575

(22) Filed: Sep. 23, 2022

(65) Prior Publication Data
US 2023/0179200 A1 Jun. 8, 2023

(30) Foreign Application Priority Data

Dec. 3, 2021 (TW) ................................. 110145258

(51) Int. Cl.
*H03K 17/56* (2006.01)
*H03K 5/24* (2006.01)

(52) U.S. Cl.
CPC ............... *H03K 17/56* (2013.01); *H03K 5/24* (2013.01)

(58) Field of Classification Search
CPC .. H03K 17/56; H03K 5/24; H03K 19/018514; H03K 19/094; H03K 19/018521; H03K 17/6872; H03K 17/693; H03K 19/018528; H03K 19/01855; H03K 19/018578; H03K 19/018585; H03K 19/09436; H03K 5/003; H03F 3/45071; G06F 13/4086; H03M 9/00; H04L 25/028; H04L 25/03343; H04B 1/04
See application file for complete search history.

(56) References Cited

U.S. PATENT DOCUMENTS 10,491,436 B1 * 11/2019 Lim ............... H03K 19/017545
2004/0104757 A1 * 6/2004 Vargas ............... H04L 25/0278
327/334

(Continued)

OTHER PUBLICATIONS

H. Zhang et al., "Bandgap Reference: Basics", Texas A&M University—ECEN 607, https://people.engr.tamu.edu/s-sanchez/607%20Lect%204%20Bandgap-2009.pdf (Year: 2009).*

(Continued)

*Primary Examiner* — Lincoln D Donovan
*Assistant Examiner* — Tyler J Pereny
(74) *Attorney, Agent, or Firm* — WPAT, P.C

(57) ABSTRACT

A voltage-mode transmitter includes a serializer, a pre-driver circuit, a driver circuit, and a resistor calibration circuit. The serializer converts a data into a serial data. The pre-driver circuit drives the serial data. The driver circuit includes a slice, a replica slice, a reference voltage generation circuit, a first operational amplifier, and a second operational amplifier. The reference voltage generation circuit is coupled between a first system voltage and a second system voltage and includes a resistor. The resistor calibration circuit is configured to use a first current source and a reference resistor to generate a reference voltage, the first current source being a current source having been calibrated by a bandgap reference (BGR) circuit; to generate a target voltage by causing a current of a second current source to flow through the resistor; and to adjust the resistor according to the reference voltage and the target voltage.

19 Claims, 5 Drawing Sheets

(56) References Cited

U.S. PATENT DOCUMENTS

2007/0139123 A1    6/2007  Liu
2011/0309857 A1*  12/2011  Flynn .................. H03F 1/56
                                                        326/30
2014/0368249 A1*  12/2014  Lee .................. H03K 5/131
                                                        327/261

OTHER PUBLICATIONS

OA letter of a counterpart TW application (appl. No. 110145258) mailed on Jul. 4, 2022.Summary of the TW OA letter: Claim(s) 1 and 6-8 is/are rejected under Patent Law Article 22(2) as being unpatentable over reference 1 (US 2007/0139123 A1). Claim correspondence between the TW counterpart application and the instant US application: Claims 1-8 in the TW counterpart application correspond to claims 1-8 in the instant US application, respectively.
Chan et al. IEEE paper: "A 32.75-Gbs Voltage-Mode Transmitter With Three-Tap FFE in 16-nm CMOS", Oct. 2017, IEEE Journal of solid-state circuits, IEEE.

* cited by examiner

VOLTAGE-MODE TRANSMITTER

BACKGROUND OF THE INVENTION

1. Field of the Invention

The present invention generally relates to voltage-mode transmitter, and, more particularly, to a driver circuit of the voltage-mode transmitter and a resistor calibration circuit therefor.

2. Description of Related Art

FIG. 1 is a schematic diagram of a conventional chip. The chip 10 includes a main circuit 110, a serializer 120, a pre-driver circuit 130, and a driver circuit 140. The serializer 120 serializes, according to the clock CLK, the parallel data DP generated by the main circuit 110 to generate serial data DS, and then the serial data DS passes through the pre-driver circuit 130 and the driver circuit 140 before outputted via the pin PD1 and pin PD2. RL is the load resistor. The pre-driver circuit 130 and the driver circuit 140 are configured to drive the output of the serial data DS, and since the operating principles thereof are well known to a person having ordinary skill in the art, they are omitted for brevity.

The internal resistor of the driver circuit 140 needs to be matched with the load resistor RL. However, because there are often changes in the resistance value of the internal resistor of the driver circuit 140 due to some factors (e.g., changes in process, voltage, and temperature), an external resistor RE (outside the chip 10) with a precise resistance value is used in the prior art as a reference for calibrating the internal resistor of the driver circuit 140. The disadvantage of this approach is that the chip 10 needs to provide the additional pins PD3 and PD4, which results in the increment of the area and cost of the chip 10.

SUMMARY OF THE INVENTION

In view of the issues of the prior art, an object of the present invention is to provide a voltage-mode transmitter, so as to make an improvement to the prior art.

According to one aspect of the present invention, a voltage-mode transmitter is provided. The voltage-mode transmitter outputs signals through a first output pin and a second output pin and includes a serializer, a pre-driver circuit, a driver circuit, and a resistor calibration circuit. The serializer is configured to convert a data into a serial data. The pre-driver circuit is coupled to the serializer and configured to drive the serial data. The driver circuit includes a slice, a replica slice, a reference voltage generation circuit, a first operational amplifier, and a second operational amplifier. The slice includes a first transistor and a second transistor and is configured to provide an output signal to the first output pin or the second output pin. The replica slice is coupled to the slice and includes a third transistor and a fourth transistor. A first gate of the first transistor is coupled to a third gate of the third transistor, and a second gate of the second transistor is coupled to a fourth gate of the fourth transistor. The reference voltage generation circuit is coupled between a first system voltage and a second system voltage, includes a resistor, and is configured to generate a first reference voltage and a second reference voltage at two ends of the resistor, respectively. The first operational amplifier is coupled between the replica slice and the reference voltage generation circuit and configured to receive the first reference voltage and provide a first gate voltage to the first gate and the third gate. The second operational amplifier is coupled between the replica slice and the reference voltage generation circuit and configured to receive the second reference voltage and provide a second gate voltage to the second gate and the fourth gate. The resistor calibration circuit is configured to use a first current source and a reference resistor to generate a third reference voltage, the first current source having been calibrated using a bandgap reference (BGR) circuit; to generate a target voltage by causing a current of a second current source to flow through the resistor; and to adjust the resistor according to the third reference voltage and the target voltage.

The voltage-mode transmitter of the present invention can compensate for or calibrate the changes in the resistance value caused by the process variation without external resistor. In comparison with the prior art, the chip utilizing the voltage-mode transmitter of the present invention can reduce the number of pins.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a voltage-mode transmitter. On account of that some or all elements of the voltage-mode transmitter could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1:
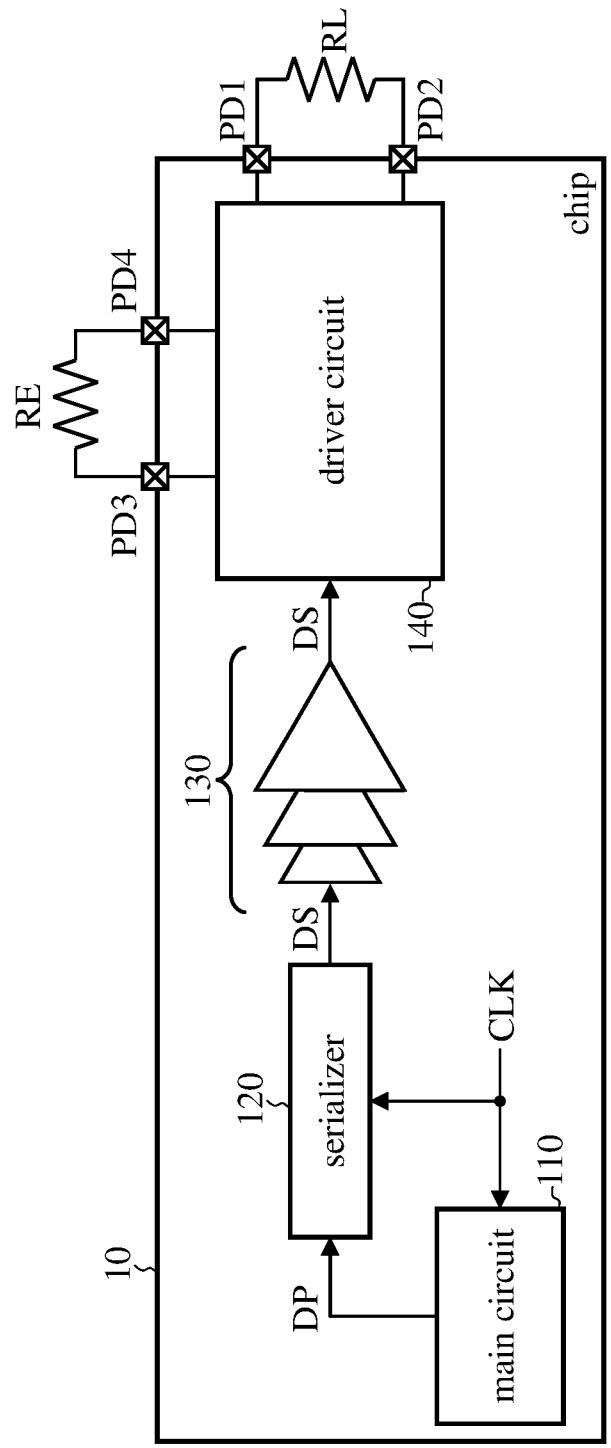
FIG. 1 is a schematic diagram of a conventional chip.
Figure 2:
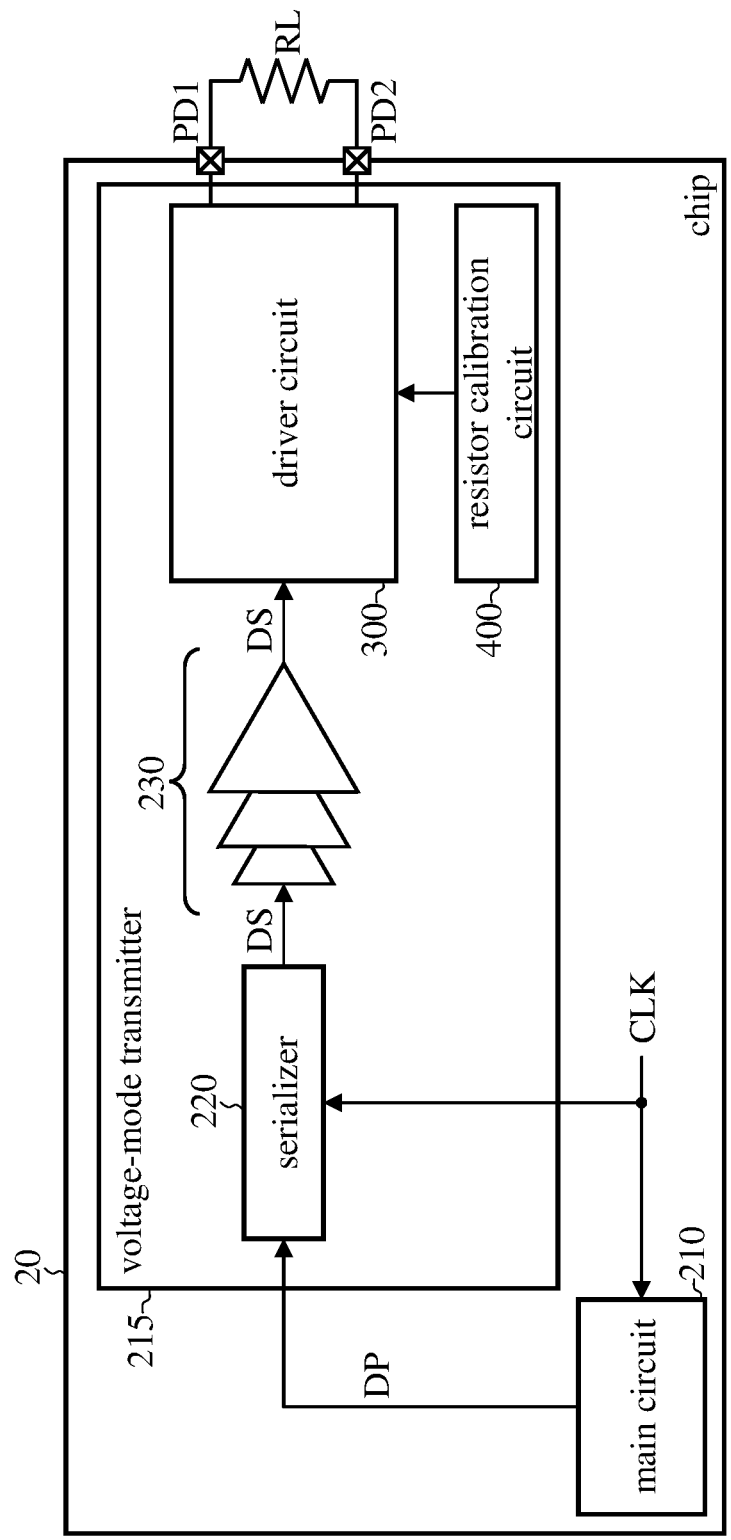
FIG. 2 is a functional block diagram of a chip according to an embodiment of the present invention.

FIG. 2 is a functional block diagram of a chip according to an embodiment of the present invention. The chip 20 (e.g., a System on a Chip (SoC)) includes a main circuit 210 and a voltage-mode transmitter 215. The main circuit 210 operates according to the clock CLK to carry out the main functions of the chip 20. The voltage-mode transmitter 215 converts the parallel data DP generated by the main circuit 210 into the serial data DS which is outputted through the output pins PD1 and PD2 of the chip 20. The functions and operating principles of the serializer 220 and the pre-driver circuit 230 are the same as those of the serializer 120 and the pre-driver circuit 130, respectively and thus omitted for brevity. The driver circuit 300 is configured to drive the serial data DS. The present invention utilizes the resistor calibration circuit 400 inside the chip 20 to calibrate the resistor inside the driver circuit 300; therefore the chip 20 of the present invention does not require additional pins to connect an external resistor.

Figure 3:
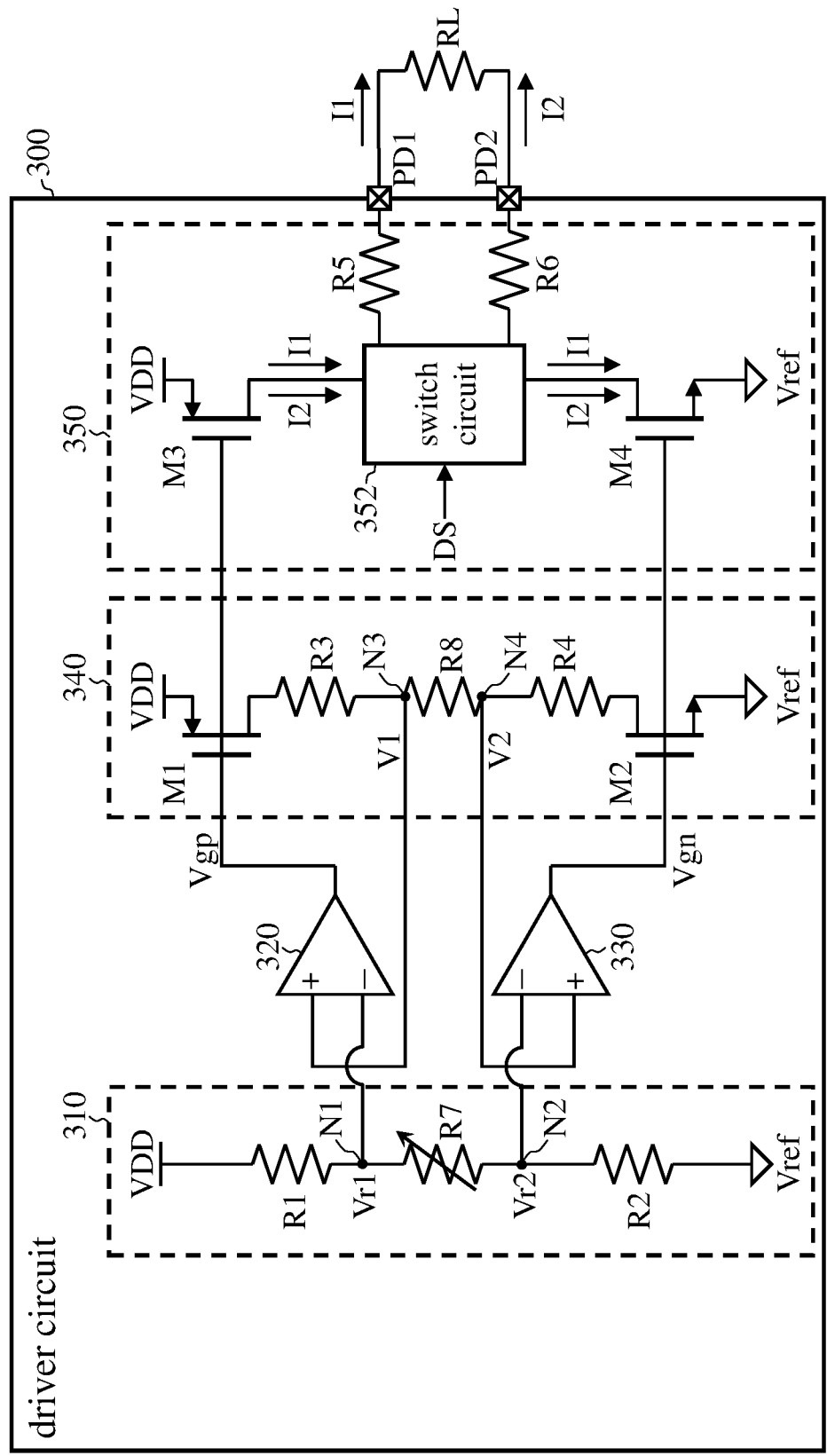
FIG. 3 is a circuit diagram of a driver circuit according to an embodiment of the present invention.

FIG. 3 is a circuit diagram of the driver circuit 300 according to an embodiment of the present invention. The driver circuit 300 includes a reference voltage generation circuit 310, an operational amplifier 320, an operational amplifier 330, a replica slice 340, and a slice 350.

The reference voltage generation circuit 310 includes a resistor R1, a resistor R7, and a resistor R2, of which the resistor R7 is an adjustable resistor. The resistor R1, the resistor R7, and the resistor R2 are connected in series between the system voltage VDD and the system voltage Vref (VDD is greater than Vref, and Vref can be a ground level). More specifically, one end of the resistor R1 is coupled or electrically connected to the system voltage VDD, while the other end of the resistor R1 is coupled or electrically connected to the node N1; one end of the resistor R7 is coupled or electrically connected to the node N1, while the other end of the resistor R7 is coupled or electrically connected to the node N2; one end of the resistor R2 is coupled or electrically connected to the node N2, while the other end of the resistor R2 is coupled or electrically connected to the system voltage Vref. Through voltage division, the reference voltage generation circuit 310 generates the reference voltage Vr1 and the reference voltage Vr2 at the node N1 and the node N2, respectively. When the resistance value of the resistor R7 changes, the reference voltage Vr1 and the reference voltage Vr2 change.

The operational amplifier 320 has two input terminals and one output terminal. One input terminal of the operational amplifier 320 is coupled or electrically connected to the node N1, the other input terminal of the operational amplifier 320 is coupled or electrically connected to the node N3, and the output terminal of the operational amplifier 320 outputs the gate voltage Vgp. The operational amplifier 330 has two input terminals and one output terminal. One input terminal of the operational amplifier 330 is coupled or electrically connected to the node N2, the other input terminal of the operational amplifier 330 is coupled or electrically connected to the node N4, and the output terminal of the operational amplifier 330 outputs the gate voltage Vgn. It is known to a person having ordinary skill in the art that the operational amplifier 320 and the operational amplifier 330 generate the voltage V1 and the voltage V2 at the node N3 and the node N4, respectively, and the voltages V1 and V2 are substantially equal to the reference voltage Vr1 and the reference voltage Vr2, respectively.

The replica slice 340 includes a transistor M1, a transistor M2, a resistor R3, a resistor R4, and a resistor R8. The source of the transistor M1 is coupled or electrically connected to the system voltage VDD, and the gate of the transistor M1 is coupled or electrically connected to the output terminal of the operational amplifier 320. The source of the transistor M2 is coupled or electrically connected to the system voltage Vref, and the gate of the transistor M2 is coupled or electrically connected to the output terminal of the operational amplifier 330. The resistor R3, the resistor R8, and the resistor R4 are connected in series between the drain of the transistor M1 and the drain of the transistor M2. More specifically, one end of the resistor R3 is coupled or electrically connected to the drain of the transistor M1, while the other end of the resistor R3 is coupled or electrically connected to the node N3; one end of the resistor R8 is coupled or electrically connected to the node N3, while the other end of the resistor R8 is coupled or electrically connected to the node N4; one end of the resistor R4 is coupled or electrically connected to the node N4, while the other end of the resistor R4 is coupled or electrically connected to the drain of the transistor M2.

The slice 350 includes a transistor M3, a transistor M4, a resistor R5, a resistor R6, and a switch circuit 352. The source of the transistor M3 is coupled or electrically connected to the system voltage VDD, and the gate of the transistor M3 is coupled or electrically connected to the output terminal of the operational amplifier 320. The source of the transistor M4 is coupled or electrically connected to the system voltage Vref, and the gate of the transistor M4 is coupled or electrically connected to the output terminal of the operational amplifier 330. The switch circuit 352 is coupled between the drain of the transistor M3 and the drain of the transistor M4. One end of the resistor R5 is coupled or electrically connected to the switch circuit 352, while the other end of the resistor R5 is coupled or electrically connected to the output pin PD1. One end of the resistor R6 is coupled or electrically connected to the switch circuit 352, while the other end of the resistor R6 is coupled or electrically connected to the output pin PD2. The switch circuit 352 outputs the current I1 through the output pin PD1 or the current I2 through the output pin PD2 according to the serial data DS. The path of the current I1 is: M3→R5→RL→R6→M4; the path of the current I2 is: M3→R6→RL→R5→M4. A person having ordinary skill in the art knows how to implement the switch circuit 352 using logic circuits and transistors; thus, the details are omitted for brevity. The scope of the claimed invention is not limited to the implementation of the switch circuit 352.

Reference is made to FIG. 3. In one embodiment which is not intended to limit the scope of the claimed invention, the resistance value of the resistor R1 is substantially equal to the resistance value of the resistor R2, and the resistance values of the resistor R3, the resistor R4, the resistor R5, and the resistor R6 are substantially the same.

FIG. 3 shows only one slice 350; however, in other embodiments, the driver circuit 300 may include K slices 350 connected in parallel (K≥2), and the resistance value of the resistor R8 is ideally equal to K times the resistance value of the load resistor RL. Connecting multiple slices 350 in parallel is known to a person having ordinary skill in the art, and the details are thus omitted for brevity.

The impedance matching of the transistor M3 and that of the transistor M4 are respectively controlled by the gate voltage Vgp and the gate voltage Vgn in a way that the variations in the process, voltage and temperature are offset or canceled. The variation in the resistance value of the resistor R8 is compensated for or calibrated by adjusting the resistance value of the resistor R7, and the resistance value of the resistor R7 is adjusted by the resistor calibration circuit 400. In other words, the present invention indirectly compensates for or calibrates the resistor R8 by adjusting the resistor R7.

Figure 4:
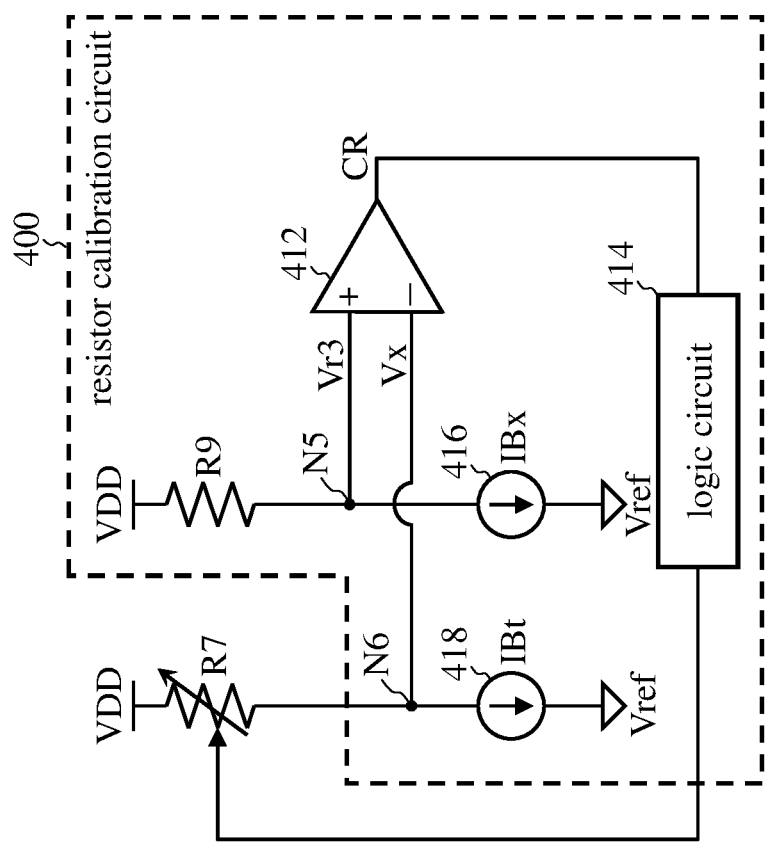
FIG. 4 shows a circuit diagram of a resistor calibration circuit according to an embodiment of the present invention.

FIG. 4 shows a circuit diagram of the resistor calibration circuit 400 according to an embodiment of the present invention. The resistor calibration circuit 400 includes a reference resistor R9, a comparator 412, a logic circuit 414, a current source 416 (with current value IBx), and a current source 418 (with current value IBt). As shown in FIG. 4, the current of the current source 416 flows through the reference resistor R9; as a result, the reference voltage Vr3 at the node N5 is VDD−R9*IBx. The current of current source 418 flows through resistor R7; as a result, the target voltage Vx at the node N6 is VDD−R7*IBt. The comparator 412 and the logic circuit 414 adjust the resistance value of the resistor R7 according to the reference voltage Vr3 and the target voltage Vx. More specifically, the comparator 412 compares the reference voltage Vr3 and the target voltage Vx to generate a comparison result CR. When the comparison result CR indicates that the reference voltage Vr3 is greater than the target voltage Vx, the logic circuit 414 controls the resistance value of the resistor R7 to become smaller; as a result, the target voltage Vx increases. When the comparison result CR indicates that the reference voltage Vr3 is smaller than the target voltage Vx, the logic circuit 414 controls the resistance value of the resistor R7 to become larger; as a result, the target voltage Vx decreases. A person having ordinary skill in the art can implement the logic circuit 414 based on operational logic discussed above, and the details are omitted for brevity. The present invention is not limited to the implementation of the logic circuit 414.

As shown in FIGS. 2 and 4, the reference resistor R9, the current source 416, and the current source 418 are part of the voltage-mode transmitter 215. In other words, the reference resistor R9, the current source 416, and the current source 418 are arranged inside the chip 20.

Reference is made to FIG. 4. The resistor R7 and the reference resistor R9 are both on-chip resistors, which are affected by the process variation. The current source 416 is a current source that has been calibrated using a bandgap reference (BGR) circuit, while the current source 418 is a current source that has not been calibrated. In other words, the current source 418 is affected by the process variation, whereas the current source 416 is not. That is to say, the resistor calibration circuit 400 first obtains the difference (which reflects the effect of the process variation) between the current source 416 and the current source 418 by comparing the reference voltage Vr3 with the target voltage Vx, and then offsets the process variation by adjusting the resistor R7. In reference to FIG. 3, since the voltage across the resistor R7 is substantially equal to the voltage across the resistor R8, the adjustment of the resistor R7 is equivalent to the calibration of the resistor R8.

In one embodiment which is not intended to limit the scope of the claimed invention, the resistance value of the reference resistor R9 is substantially equal to the resistance values (e.g., Rx) of the resistors R1 and R2, and the resistance value of the resistor R7 is substantially Rx±0.1Rx, where "+0.1Rx" is the adjustable range of resistor R7, which is the predicted range of the process variation.

Figure 5:
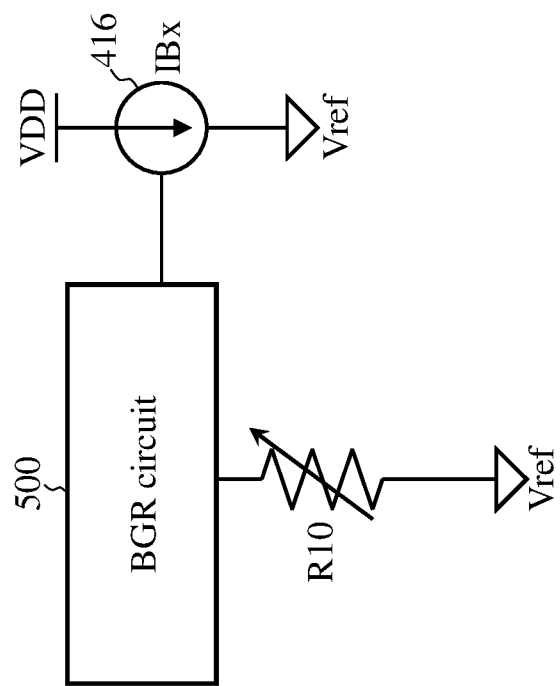
FIG. 5 is a schematic diagram of calibrating a current source using a bandgap reference (BGR) circuit.

FIG. 5 is a schematic diagram of calibrating the current source 416 using a BGR circuit. The BGR circuit 500 is coupled or electrically connected to the current source 416 and also coupled to the system voltage Vref through the resistor R10, which is adjustable. It is known to a person having ordinary skill in the art that the current source 416 can be calibrated by changing the voltage across the resistor R10; the details are omitted for brevity.

To sum up, the present invention can calibrate the resistor of the driver circuit 300 of the voltage-mode transmitter 215 to overcome process variation without using an external resistor.

Note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A voltage-mode transmitter that outputs signals through a first output pin and a second output pin, comprising:
   a serializer configured to convert a data into a serial data;
   a pre-driver circuit which is coupled to the serializer and configured to drive the serial data;
   a driver circuit, comprising:
      a slice which includes a first transistor and a second transistor and is configured to provide an output signal to the first output pin or the second output pin;
      a replica slice which is coupled to the slice and includes a third transistor and a fourth transistor, wherein a first gate of the first transistor is coupled to a third gate of the third transistor, and a second gate of the second transistor is coupled to a fourth gate of the fourth transistor;
      a reference voltage generation circuit which is coupled between a first system voltage and a second system voltage, includes a resistor, and is configured to generate a first reference voltage and a second reference voltage at two ends of the resistor, respectively;
      a first operational amplifier which is coupled between the replica slice and the reference voltage generation circuit and configured to receive the first reference voltage and provide a first gate voltage to the first gate and the third gate; and
      a second operational amplifier which is coupled between the replica slice and the reference voltage generation circuit and configured to receive the second reference voltage and provide a second gate voltage to the second gate and the fourth gate; and
   a resistor calibration circuit configured to use a first current source and a reference resistor to generate a third reference voltage, wherein the first current source has been calibrated using a bandgap reference (BGR) circuit;
      to generate a target voltage by causing a current of a second current source to flow through the resistor; and
      to adjust the resistor according to the third reference voltage and the target voltage.

2. The voltage-mode transmitter of claim 1, wherein the resistor is a first resistor, the replica slice further comprising:
   a second resistor which has a first end and a second end, wherein the first end is coupled to an input terminal of the first operational amplifier, and the second end is coupled to an input terminal of the second operational amplifier;
   a third resistor coupled between the third transistor and the second resistor; and
   a fourth resistor coupled between the second resistor and the fourth transistor.

3. The voltage-mode transmitter of claim 2, the slice further comprising:
   a switch circuit which is coupled to the first transistor and the second transistor and configured to receive the serial data;
   a fifth resistor which is coupled between the switch circuit and the first output pin; and a sixth resistor which is coupled between the switch circuit and the second output pin.

4. The voltage-mode transmitter of claim 3, wherein resistance values of the third resistor, the fourth resistor, the fifth resistor, and the sixth resistor are identical.

5. The voltage-mode transmitter of claim 1, wherein the resistor is a first resistor, the slice further comprising:
a switch circuit which is coupled to the first transistor and the second transistor and configured to receive the serial data;
a second resistor which is coupled between the switch circuit and the first output pin; and
a third resistor which is coupled between the switch circuit and the second output pin.

6. The voltage-mode transmitter of claim 1, wherein the resistor is a first resistor, the reference voltage generation circuit further comprising:
a second resistor which is coupled between the first resistor and the first system voltage; and
a third resistor which is coupled between the first resistor and the second system voltage;
wherein the second resistor is electrically connected to an input terminal of the first operational amplifier, and the third resistor is electrically connected to an input terminal of the second operational amplifier.

7. The voltage-mode transmitter of claim 1, the resistor calibration circuit further comprising:
a comparator which is configured to compare the third reference voltage and the target voltage to generate a comparison result; and
a logic circuit which is coupled to the comparator and the resistor and configured to adjust a resistance value of the resistor according to the comparison result.

8. The voltage-mode transmitter of claim 1, wherein the voltage-mode transmitter is part of a chip, and the reference resistor is inside the chip.

9. A voltage-mode transmitter that outputs signals through a first output pin and a second output pin, comprising:
a serializer configured to convert a data into a serial data;
a pre-driver circuit which is coupled to the serializer and configured to drive the serial data;
a driver circuit, comprising:
a slice which includes a first transistor and a second transistor and is configured to provide an output signal to the first output pin or the second output pin;
a replica slice which is coupled to the slice and includes a first resistor, a third transistor and a fourth transistor, wherein the first resistor is coupled between the third transistor and the fourth transistor through resistors, a first gate of the first transistor is coupled to a third gate of the third transistor, and a second gate of the second transistor is coupled to a fourth gate of the fourth transistor;
a reference voltage generation circuit which is coupled between a first system voltage and a second system voltage, includes a second resistor, and is configured to generate a first reference voltage and a second reference voltage at two ends of the second resistor, respectively;
a first operational amplifier which is coupled between the replica slice and the reference voltage generation circuit and configured to receive the first reference voltage and provide a first gate voltage to the first gate and the third gate; and
a second operational amplifier which is coupled between the replica slice and the reference voltage generation circuit and configured to receive the second reference voltage and provide a second gate voltage to the second gate and the fourth gate; and
a resistor calibration circuit configured
to use a first current source and a reference resistor to generate a third reference voltage, wherein the first current source has been calibrated using a bandgap reference (BGR) circuit;
to generate a target voltage by causing a current of a second current source to flow through the second resistor; and
to adjust the second resistor according to the third reference voltage and the target voltage.

10. The voltage-mode transmitter of claim 9, the replica slice further comprising:
a third resistor coupled between the third transistor and the second resistor; and
a fourth resistor coupled between the second resistor and the fourth transistor;
wherein the first resistor has a first end and a second end, the first end is coupled to an input terminal of the first operational amplifier, and the second end is coupled to an input terminal of the second operational amplifier.

11. The voltage-mode transmitter of claim 10, the slice further comprising:
a switch circuit which is coupled to the first transistor and the second transistor and configured to receive the serial data;
a fifth resistor which is coupled between the switch circuit and the first output pin; and
a sixth resistor which is coupled between the switch circuit and the second output pin.

12. The voltage-mode transmitter of claim 11, wherein resistance values of the third resistor, the fourth resistor, the fifth resistor, and the sixth resistor are identical.

13. The voltage-mode transmitter of claim 9, the slice further comprising:
a switch circuit which is coupled to the first transistor and the second transistor and configured to receive the serial data;
a third resistor which is coupled between the switch circuit and the first output pin; and
a fourth resistor which is coupled between the switch circuit and the second output pin.

14. The voltage-mode transmitter of claim 9, the reference voltage generation circuit further comprising:
a third resistor which is coupled between the second resistor and the first system voltage; and
a fourth resistor which is coupled between the second resistor and the second system voltage;
wherein the third resistor is electrically connected to an input terminal of the first operational amplifier, and the fourth resistor is electrically connected to an input terminal of the second operational amplifier.

15. The voltage-mode transmitter of claim 9, the resistor calibration circuit further comprising:
a comparator which is configured to compare the third reference voltage and the target voltage to generate a comparison result; and
a logic circuit which is coupled to the comparator and the second resistor and configured to adjust a resistance value of the second resistor according to the comparison result.

16. The voltage-mode transmitter of claim 9, wherein the voltage-mode transmitter is part of a chip, and the reference resistor is inside the chip.

17. The voltage-mode transmitter of claim 9, wherein a voltage across the first resistor is substantially same as a voltage across the second resistor.

18. The voltage-mode transmitter of claim 9, wherein the first operational amplifier has a first input terminal and a second input terminal, the first input terminal is electrically connected to the first resistor, and the second input terminal is electrically connected to the second resistor.

19. The voltage-mode transmitter of claim 18, wherein the second operational amplifier has a third input terminal and a fourth input terminal, the third input terminal is electrically connected to the first resistor, and the fourth input terminal is electrically connected to the second resistor.

* * * * *